United States Patent
Chen

(10) Patent No.: US 9,620,700 B2
(45) Date of Patent: Apr. 11, 2017

(54) WAFER SCALE THERMOELECTRIC ENERGY HARVESTER

(71) Applicant: Analog Devices, Inc., Norwood, MA (US)

(72) Inventor: Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 464 days.

(21) Appl. No.: 13/736,783

(22) Filed: Jan. 8, 2013

(65) Prior Publication Data

US 2014/0190543 A1    Jul. 10, 2014

(51) Int. Cl.
*H01L 35/32* (2006.01)
*H01L 27/16* (2006.01)

(52) U.S. Cl.
CPC ............ *H01L 35/325* (2013.01); *H01L 27/16* (2013.01); *H01L 35/32* (2013.01)

(58) Field of Classification Search
CPC ......... H01L 35/28; H01L 35/32; H01L 35/34; H01L 35/04
USPC ........................................ 136/203, 204, 212
See application file for complete search history.

(56) References Cited

U.S. PATENT DOCUMENTS

| | | | |
|---|---|---|---|
| 3,870,568 A | 3/1975 | Oesterhelt et al. | |
| 4,257,822 A | 3/1981 | Gomez | |
| 5,006,178 A | 4/1991 | Bijvoets | |
| 5,022,928 A | 6/1991 | Buist | |
| 5,610,366 A | 3/1997 | Fleurial et al. | |
| 5,747,728 A | 5/1998 | Fleurial et al. | |
| 6,100,463 A * | 8/2000 | Ladd et al. | 136/201 |
| 6,614,122 B1 | 9/2003 | Dory et al. | |
| 7,629,531 B2 | 12/2009 | Stark | |
| 8,399,300 B2 | 3/2013 | Lee et al. | |
| 8,853,799 B2 | 10/2014 | O'Donnell et al. | |
| 8,957,488 B2 | 2/2015 | Keysar et al. | |
| 2005/0139249 A1* | 6/2005 | Ueki | H01L 35/34 136/211 |
| 2006/0048809 A1 | 3/2006 | Onvural | |
| 2006/0118159 A1* | 6/2006 | Tsuneoka et al. | 136/211 |
| 2006/0151021 A1* | 7/2006 | Stark | H01L 35/32 136/205 |
| 2008/0178606 A1 | 7/2008 | Chen et al. | |
| 2010/0205920 A1 | 8/2010 | Czubarow et al. | |

(Continued)

FOREIGN PATENT DOCUMENTS

CN    101887944 A    11/2010

OTHER PUBLICATIONS

Bell, Cooling, Heating, Generting Power, and Recovering Waste Heat with Thermoelectric Systems, Science, vol. 321, pp. 1457-1461 (2008).*

(Continued)

*Primary Examiner* — Jayne Mershon
(74) *Attorney, Agent, or Firm* — Wolf, Greenfield & Sacks, P.C.

(57) ABSTRACT

An integrated circuit may include a substrate and a dielectric layer formed over the substrate. A plurality of p-type thermoelectric elements and a plurality of n-type thermoelectric elements may be disposed within the dielectric layer. The p-type thermoelectric elements and the n-type thermoelectric elements may be connected in series while alternating between the p-type and the n-type thermoelectric elements.

23 Claims, 3 Drawing Sheets

(56) References Cited

U.S. PATENT DOCUMENTS

| | | | |
|---|---|---|---|
| 2011/0041887 A1 | 2/2011 | Takahashi | |
| 2011/0209740 A1 | 9/2011 | Bell et al. | |
| 2011/0209744 A1* | 9/2011 | Hu | 136/248 |
| 2011/0220162 A1* | 9/2011 | Siivola | H01L 35/32 136/203 |
| 2012/0031450 A1* | 2/2012 | Kittler | H01L 27/16 136/203 |
| 2012/0090656 A1* | 4/2012 | Snyder | H01L 35/26 136/201 |
| 2012/0103379 A1 | 5/2012 | Krinn et al. | |
| 2013/0014516 A1 | 1/2013 | Yang et al. | |
| 2013/0081665 A1 | 4/2013 | Span | |
| 2013/0133338 A1* | 5/2013 | Ludwig | 62/3.3 |
| 2013/0218241 A1* | 8/2013 | Savoy | A61F 7/007 607/98 |
| 2015/0001729 A1 | 1/2015 | Lan et al. | |

OTHER PUBLICATIONS

Riffat et al., Thermoelectrics: a review of present and potential applications, Applied Thermal Engineering, vol./Issue 23, pp. 913-935 (2003).*

Xie et al., "Design, Fabrication, and Characterization of CMOS MEMS-Based Thermoelectric Power Generators," IEEE Journal of Microelectromechanical Systems, vol. 19, No. 2, pp. 317-321, Apr. 2010.

Borgesen, "Flip Chip on Organic Substrates," SMTA International Conference Proceedings, Sep. 1999, 9 pages.

Caillat et al., "Development of High Efficiency Segmented Thermoelectric Unicouples," Proceedings of the XX International Conference on Thermoelectrics (ICT 2001), Jun. 2001, 4 pages.

E.S. Reddy et al., "Fabrication and Properties of Four-Leg Oxide Thermoelectric Modules," Journal of Physics D: Applied Physics, No. 38, pp. 3751-3755, Sep. 2005.

Meng et al., "Multi-Objective and Multi-Parameter Optimization of a Thermoelectric Generator Module," Energy, vol. 71, pp. 367-376, Jul. 2014.

Mijatovic et al., "Technologies for Nanofluidic Systems: Top-down vs. Bottom-up—a Review," Lab on a Chip, Issue 5, 2005, pp. 492-500, first published Mar. 22, 2005.

O'Toole et al., "A Solid-Liquid-Vapor Mechanism for Anisotropic Silicon Etching," Applied Physics Letters 93, 263107 (2008), 3 pages.

Strasser et al., "Micromachined CMOS Thermoelectric Generators as On-Chip Power Supply," 12th International Conference on Solid-State Sensors, Actuators and Microsystems (Transducers 2003), pp. 45-48, Jun. 2003.

Y.T. Yeh et al., "Threshold Current Density of Electromigration in Eutectic SnPb Solder," Applied Physics Letters 86, 203504 (2005), 3 pages.

* cited by examiner (a)

(b)

WAFER SCALE THERMOELECTRIC ENERGY HARVESTER

BACKGROUND

The subject matter of this application is directed to a thermoelectric energy harvester, and more particularly to an integrated single chip thermoelectric energy harvester.

Thermoelectric devices convert heat (e.g., thermal energy) into electric energy. A temperature difference between a hot side and a cold side of a thermoelectric device moves charge carriers in a semiconductor material of the thermoelectric device to generate electric energy. The material of the thermoelectric device is selected such that it is a good conductor of electricity to generate the current flow but a poor conductor of heat to maintain the needed heat difference between the two sides of the thermoelectric device. The temperature difference can be generated when the one side of the thermoelectric device is placed near a heat source (e.g., an engine or a circuit) causing one side of the thermoelectric device to be hotter.

The amount of energy that can be generated by the thermoelectric device depends at least on, the temperature difference, type of materials in the thermoelectric device and the size of the thermoelectric device. For example, a greater temperature difference between a hot side and a cold side of the device can generate more current flow. In addition, thermoelectric devices with larger surface areas and/or larger materials generating the current flow have traditionally produced more electric energy. These various factors are adjusted depending on the application for which the thermoelectric device is used.

There is a growing interest to scale down the size of thermoelectric devices for new applications (e.g., self sustainable sensors or mobile devices) and to produce thermoelectric devices which can be part of integrated circuits. However, scaling down the size of the thermoelectric device introduces new challenges such as generating enough energy and keeping manufacturing costs low. In addition, traditional materials and/or arrangements of the materials within the thermoelectric device may not provide the needed energy for certain applications. Other challenges include dealing with parasitic heat loss effecting adjacent components in the integrated circuit.

Accordingly, the Inventor has identified a need in the art for small scale thermoelectric devices that include high energy density, are low cost and address parasitic heat loss.

BRIEF DESCRIPTION OF THE DRAWINGS

So that features of the present invention can be understood, a number of drawings are described below. It is to be noted, however, that the appended drawings illustrate only particular embodiments of the disclosure and are therefore not to be considered limiting of its scope, for the invention may encompass other equally effective embodiments.

DETAILED DESCRIPTION

Figure 1:
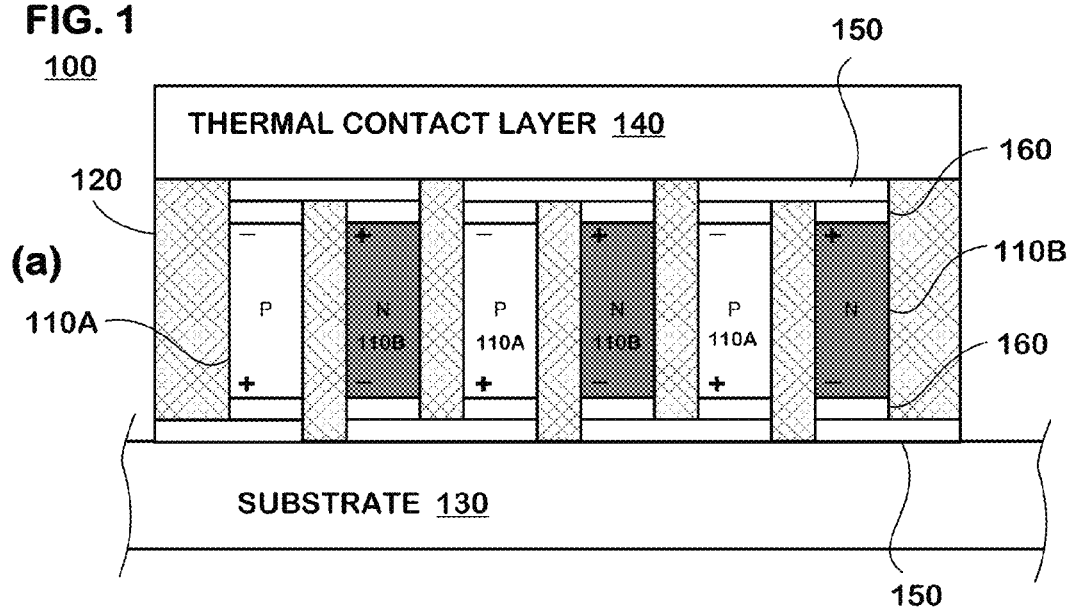
FIGS. 1(a) and 1(b) illustrate an exemplary configuration of a thermoelectric energy harvester according to an embodiment of the present invention.

Embodiments of the present invention may provide for a thermoelectric energy harvester that can be provided in an integrated circuit. In one embodiment, an integrated circuit may include a substrate and a dielectric layer formed over the substrate. A plurality of p-type thermoelectric elements and a plurality of n-type thermoelectric elements may be disposed within the dielectric layer. The p-type thermoelectric elements and the n-type thermoelectric elements may be electrically connected in series in an alternating fashion. In response to heat being applied to one side of the thermoelectric elements, flow of electrons may be generated in each of the thermoelectric elements to provide electric energy.

In another embodiment, a cap may be provided above a substrate to enclose a plurality of p-type and n-type thermoelectric elements disposed above the substrate and connected in series while alternating between the p-type and the n-type thermoelectric elements. A vacuum or a low pressure may be maintained between the thermoelectric elements. The cap and the vacuum or low pressure may reduce parasitic heat loss into the area surrounding the integrated circuit and thus maintain large thermal gradient along the thermoelectric elements.

FIG. 1(a) illustrates an exemplary configuration of a thermoelectric energy harvester 100 according to an embodiment of the present invention. The thermoelectric energy harvester 100 may include a plurality of thermoelectric elements 110A, 110B above a substrate layer 130 and within a dielectric layer 120. The thermoelectric elements 110A, 110B may include elements of different types of thermoelectric material (e.g., p-type and n-type). The thermoelectric elements 110A, 110B may be interconnected such that each thermoelectric element contributes to the overall energy provided by the thermoelectric energy harvester 100 in response to a temperature gradient between a first side (e.g., hot side) and a second side (e.g., cold side). A thermal contact layer 140 may be provided above the dielectric layer 120 to support the temperature gradients between the first side and the second side. The thermal contact layer 140 may be made of a material that is a good heat conductor.

As shown in FIG. 1(a), the thermoelectric energy harvester 100 may include a vertical structure provided with the dielectric layer 120 and may be formed as a single wafer. The wafer scale structure of the thermoelectric energy harvester 100 allows it to be integrated with other integrated circuit components (not shown in FIG. 1(a)) on or near the substrate 130.

As indicated, the thermoelectric elements 110A, 110B may include different types of thermoelectric materials (e.g., p-type and n-type). The thermoelectric material of the thermoelectric elements 110A, 110B may be selected to generate a flow of charge carriers of different polarity from one end of the thermoelectric element to an opposite end, in response to a temperature difference between the two ends. In a thermoelectric element 110A including p-type material, the positive charge carriers flow from a hot end to an opposite cold end. In contrast, in a thermoelectric element 110B including n-type material, the electrons flow from an end having the heat source to the opposite end which is cooler.

The plurality of the thermoelectric elements 110A, 110B may be connected in an array while alternating the type of material (e.g., between n-type and p-type) in the adjacent thermoelectric elements 110A and 110B. In this manner, the voltages and/or currents that are developed across the thermoelectric elements 110A and 110B may be summed together to generate a larger aggregate voltage and/or current than the thermoelectric elements 110A and 110B do individually. For example, thermoelectric elements 110A having p-type material may be connected in series with thermoelectric elements 110B having n-type material. The thermoelectric elements 110A, 110B may be arranged such that all of the adjacent thermoelectric elements to a given thermoelectric element include a type of material that is different to the material of the given thermoelectric element. Outputs of the arrays of the thermoelectric elements 110A and 110B may be connected in parallel to provide the energy required in a particular application. Interconnects 150 may connect the thermoelectric elements 110A and 110B to adjacent thermoelectric elements 110A and 110B.

While each thermoelectric element 110A, 110B may provide a small amount of energy (e.g., millivolts), connecting the thermoelectric elements 110A, 110B in an array may provide the higher energy needed for a particular application. When heat is applied to one side of the thermoelectric energy harvester 100, electrons in the thermoelectric elements 110A having p-type material will flow from the cold side to the hot side of the thermoelectric elements 110A and the electrons in the thermoelectric elements 110B having n-type material will flow from the hot side to the cold side of the thermoelectric elements 110B. Thus, if the thermoelectric elements 110A are connected in series with the thermoelectric elements 110B, forming a thermoelectric couple, the electrons will flow from a cold side of the p-type material, to a hot side of the p-type material, into the hot side of the n-type material via the interconnect 150, and into the cold side of the n-type material. The energy generated in each of the thermoelectric elements 110A, 110B is combined and provided at the output terminals of the thermoelectric energy harvester 100.

FIG. 1(b) illustrates a circuit equivalent of the thermoelectric energy harvester 100 shown in FIG. 1(a). The voltages that are developed across the thermoelectric elements 110A and 110B are represented by Vp and Vn. The individual voltages and/or currents may be summed together to provide and aggregate output voltage Vout, and in the case drawn, the voltage is summed to get a useful voltage that can power a typical low power electronic circuit.

FIG. 1(a) is not drawn to scale but describes coarse dimensions of a harvester 100 in one embodiment. The thermoelectric elements 110A, 110B may have a shape that maximizes the surface of the thermoelectric element 110A, 110B that is adjacent to the dielectric layer 120. The thermoelectric elements 110A, 110B may have a rectangular shape with the sides having a longer end being adjacent to the dielectric layer 120 and the shorter sides being adjacent to the interconnects 150. In another embodiment, at least one side of the thermoelectric elements 110A, 110B may be a square.

The material of the thermoelectric elements 110A, 110B may be selected such that the thermal resistance of the thermoelectric elements 110A, 110B is smaller than the thermal resistance of the dielectric layer 120 so that the dielectric layer will not cause too much thermal shunting. A high thermal resistance of the thermoelectric elements 110A, 110B is still needed to ensure that a good temperature difference is maintained between a hot side and a cold side of the thermoelectric elements 110A, 110B. The thermal resistance of the thermoelectric elements 110A, 110B may be increased by the controlling the doping level of the thermoelectric elements 110A, 110B or by introducing scattering elements to increase the photon scattering in the thermoelectric elements 110A, 110B without affecting too much on their electric conduction. The concentration of the doping level or the scattering elements may be increased or decreased at one end of the thermoelectric elements 110A, 110B as compared to an opposite end of the thermoelectric element 110A, 110B.

For example, thermoelectric elements 110A can be p-type $Bi_xSb_{2-x}Te_3$ and thermoelectric elements 110B can be n-type $Bi_2Te_{3-x}Se_x$. The dielectric layer 120 can be a polyimide, as it has low thermal conductivity and it helps on processing of the thermoelectric elements. The thermal contact layer 140 can be any electrically insulating but thermally conductive layer. In one embodiment, the thermal contact layer 140 can be made of multiple layers. For example, the thermal contact layer 140 may include a thin non-conductive layer such as oxide or nitride and one or more thicker metal layers on top to enhance thermal conduction. The thermal contact layer 140 may provide insulation at the interface to electric interconnection layer 150 to prevent electric short of electric interconnection layers 150. The substrate 130 can be any semiconducting substrate with enough thickness to promote thermal conduction at the bottom side. While the configuration of the substrate 130 as cold side and the top thermal contact layer 140 as the hot side is shown, the device can also function with the substrate 130 as the hot side and top thermal contact layer 140 as the cold side.

The interconnects 150 may be included on a hot side and on a cold side of the thermoelectric elements to connect adjacent thermoelectric elements. The thermoelectric elements may include a first interconnect on a hot side coupled to a first thermoelectric element and a second interconnect on a cold side coupled to a second thermoelectric element. The interconnects 150 at the first and last thermoelectric elements 110A, 110B may be output terminals to connect to other circuit components (e.g., external circuits, load or an energy storage device). The interconnects 150 may include a semiconductor material or a metallic connector (e.g., gold, copper or aluminum).

In the exemplary embodiments, the dielectric layer 120 may be high dielectric breakdown materials such as polyimide, silicon dioxide, silicon nitride and the like. The dielectric layer 120 may electrically insulate the thermoelectric elements 110A, 110B. The dielectric layer 120 may suppress the conduction of heat away from the thermoelectric elements 110A, 110B. The dielectric layer 120 may have a lower thermal conductivity than the substrate 130 and/or the thermoelectric elements 110A, 110B. The dielectric layer 120 may surround the thermoelectric elements 110A, 110B at four sides to thermally shunt the thermoelectric elements 110A, 110B and allow the thermal gradient be developed across the thermoelectric elements 110A, 110B and to allow most heat to travel to the sides of the thermoelectric energy harvester 100. Higher thermal resistance of the thermoelectric elements 110A, 110B as compared to the thermal resistance of the substrate 130 and/or thermal contact layer 140, allows the available thermal gradient to drop across the thermoelectric elements rather than the thermal contact layer or the substrate 130. Thus, a maximum temperature difference is maintained between the hot side and the cool side of the thermoelectric elements 110A, 110B.

Barrier metals 160 may be included between the thermoelectric elements 110A, 110B and the interconnects 150 to isolate the semiconductor materials of the thermoelectric elements 110A, 110B from the metal interconnects 150, while maintaining an electrical connection between the thermoelectric elements 110A, 110B and the interconnects 150. The barrier metals 160 may be included to prevent diffusion of the interconnects 150 into the semiconductor materials of the thermoelectric elements 110A, 110B.

When heat is applied to one side (e.g., hot side) of the thermoelectric energy harvester 100, electrons flow in one direction in the thermoelectric elements 110A having the p-type material and in another direction in the thermoelectric elements 110B having the n-type material. Because the thermoelectric elements 110A, 110B are connected in series, the energy generated in each of the thermoelectric elements 110A, 110B is combined to provide the combined energy at the outputs of the thermoelectric energy harvester 100. The incoming heat is distributed by the thermal contact layer 140 to the hot side of the thermoelectric elements 110A, 110B while the substrate 130 cools the cool side of the thermoelectric elements 110A, 110B.

Figure 2:
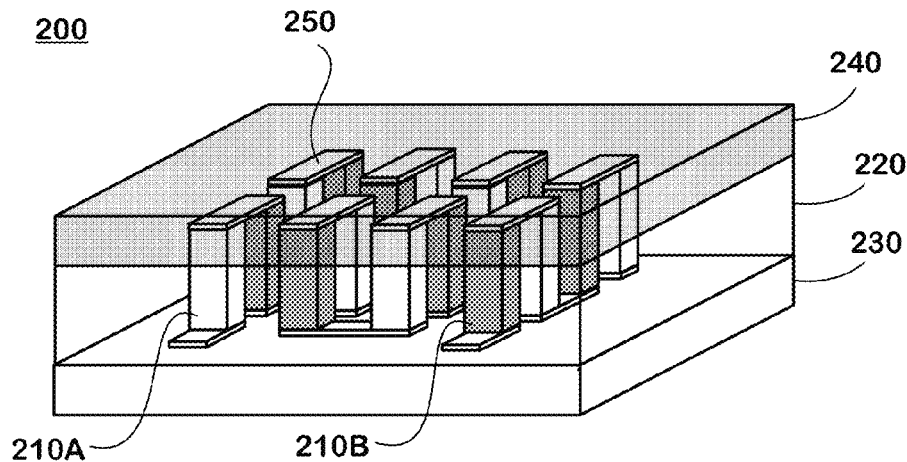
FIG. 2 illustrates a perspective view of a thermoelectric energy harvester 100 according to an embodiment of the present invention.

FIG. 2 illustrates a perspective view of a thermoelectric energy harvester 200 according to an embodiment of the present disclosure. As shown in FIG. 2, the thermoelectric elements 210A, 210B are provided above the substrate layer 230. A dielectric layer 220 is provided above the substrate layer 230 to electrically isolate the thermoelectric elements 210A, 210B from each other. The thermoelectric elements 210A, 210B may be arranged in an array such that the thermoelectric elements 210A, 210B while alternating the type of material (e.g., between n-type and p-type) in the adjacent thermoelectric elements 210A and 210B. Interconnects 250 may connect the thermoelectric elements 210A, 210B in series. A thermal contact layer 240 may disperse the applied heat to the thermoelectric elements 210A, 210B.

Figure 3:
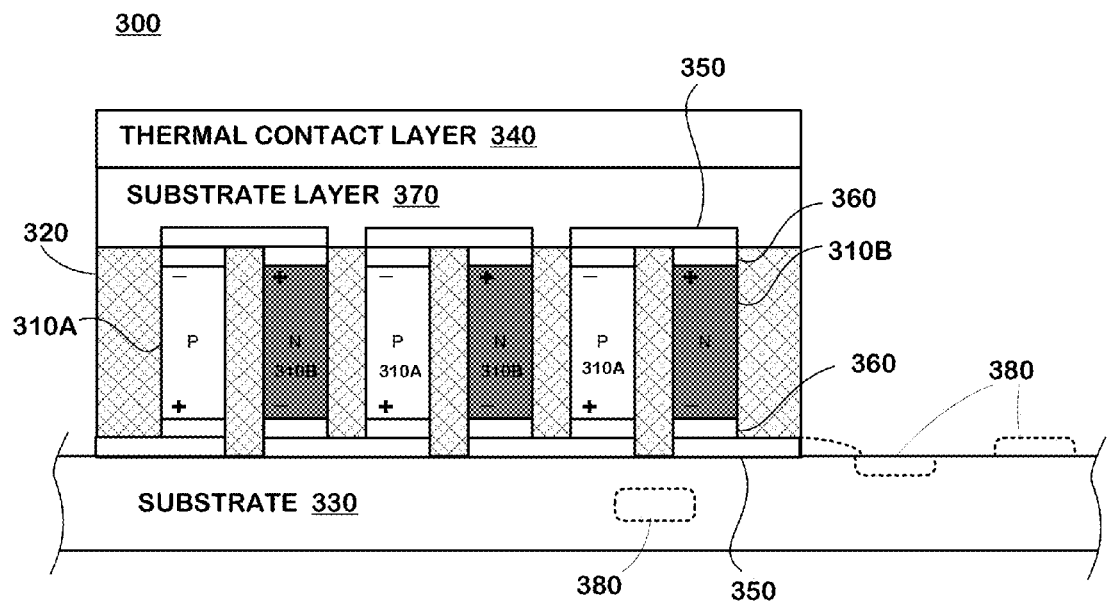
FIG. 3 illustrates an exemplary configuration of a thermoelectric energy harvester according to another embodiment of the present invention.

FIG. 3 illustrates an exemplary configuration of a thermoelectric energy harvester 300 according to another embodiment of the present disclosure. The thermoelectric energy harvester 300 may include a plurality of thermoelectric elements 310A, 310B above the substrate layer 330 and within a dielectric layer 320 above the substrate layer 330. The thermoelectric elements 310A, 310B may be arranged in an array while alternating the type of material (e.g., between n-type and p-type) in the adjacent thermoelectric elements 310A and 310B. The plurality of thermoelectric elements 310A, 310B may be connected in series via interconnects 350. A thermal contact layer 340 may be provided above the thermoelectric elements 310A, 310B to dissipate the heat applied to the thermoelectric energy harvester 300.

The thermoelectric energy harvester 300 may include an additional substrate layer 370 between the thermal contact layer 340 and the dielectric layer 320. The substrate layer 370 may have a high thermal conductivity to dissipate heat from the external heat source. The substrate layer 370 may be an aluminum nitride substrate.

The thermoelectric energy harvester 300 may include one or more circuit components 380 in the substrate 330 and/or on a surface of the substrate 330. The circuit components 380 may be coupled the output terminals of the thermoelectric energy harvester 300. The circuit components 380 may receive the energy generated by the thermoelectric energy harvester 300 and/or control the thermoelectric energy harvester 300. The circuit components 380 may be parts of a sensor (e.g., automotive sensor, medical implant, and/or wireless sensor) being powered by the thermoelectric energy harvester 300. In one embodiment, current may be supplied to the thermoelectric elements 310A, 310B via the circuit components 380 for the thermoelectric energy harvester 300 to function as a cooler. The thermoelectric energy harvester 300 functioning as a cooler may cool circuit components 380 within the substrate 330 or provided near or on the surface of the substrate 330. The current applied to the thermoelectric elements 310A, 310B may create flow of charge carriers that generate a temperature difference between the two sides of the thermoelectric energy harvester 300 that can be used to cool the circuit components 380.

Barrier metals 360 may be included between the thermoelectric elements 310A, 310B and the interconnects 350 to isolate the semiconductor materials of the thermoelectric elements 310A, 310B from the metal interconnects 350, while maintaining an electrical connection between the thermoelectric elements 310A, 310B and the interconnects 350.

Figure 4:
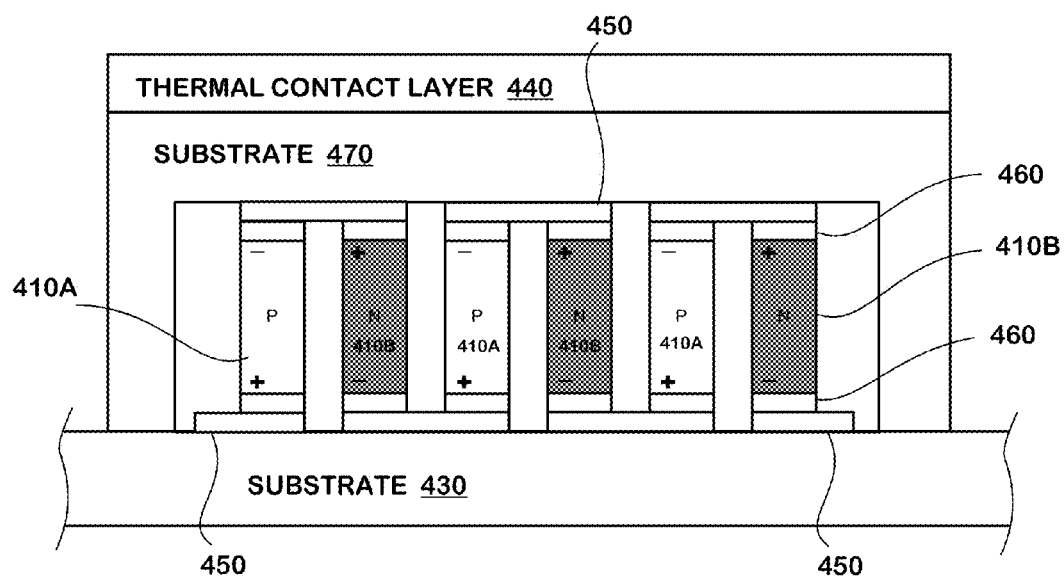
FIG. 4 illustrates an exemplary configuration of a thermoelectric energy harvester with a capping structure according to an embodiment of the present invention.

FIG. 4 illustrates an exemplary configuration of a thermoelectric energy harvester 400 with a capping structure according to an embodiment of the present disclosure. The thermoelectric energy harvester 400 may include a capping substrate 470 to enclose the thermoelectric elements 410A, 410B provided above the substrate 430. The capping substrate 470 may allow for low pressure or vacuum to be maintained between the substrate 430 and the capping substrate 470.

The capping substrate 470 may enclose the thermoelectric elements 410A, 410B between the capping substrate 470 and the substrate 410. The capping substrate 470 may be attached to the substrate 410 under pressure or vacuum such that the low pressure or vacuum is provided around the thermoelectric elements 410A, 410B.

The capping substrate 470 and/or the low pressure or vacuum may reduce the parasitic heat loss into the area surrounding the thermoelectric elements 410A, 410B. Reducing the parasitic heat loss allows for the thermoelectric energy harvester 400 to be scaled down and included as part of an integrated circuit. Reduced parasitic heat loss at small levels allows for other circuits to be included together with the thermoelectric energy harvester 400.

The capping substrate 470 may allow for more energy to be harvested by the thermoelectric energy harvester 400. The vacuum or low pressure allows for the temperature gradient between the hot and cold side of the thermoelectric elements 410A, 410B to be maximized.

Similar to the embodiments shown in FIGS. 1-3, the thermoelectric elements 410A, 410B may be arranged in an array with alternating the type of material (e.g., between n-type and p-type) in the adjacent thermoelectric elements 410A and 410B. The plurality of thermoelectric elements 410A, 410B may be connected in series via interconnects 450. A thermal contact layer 440 may be provided above the thermoelectric elements 410A, 410B to dissipate the heat to the thermoelectric elements 410A, 410B.

Barrier metals 460 may be included between the thermoelectric elements 410A, 410B and the interconnects 450 to isolate the materials of the thermoelectric elements 410A, 410B from the interconnects 450, while maintaining an electrical connection between the thermoelectric elements 410A, 410B and the interconnects 450.

In one embodiment the p-type and the n-type thermoelectric elements may both be provided on one of the capping substrate 470 and the substrate 430 before bonding the capping substrate 470 to the substrate 430. In another embodiment, before the capping substrate 470 is bonded to the substrate 430, p-type thermoelectric elements may be provided on one of the capping substrate 470 and the substrate 430 and the n-type thermoelectric elements may be provided on the other one of the capping substrate 470 and the substrate 430. Bonding the capping substrate 470 to the substrate 430 would couple the p-type thermoelectric elements and the n-type thermoelectric elements.

Figure 5:
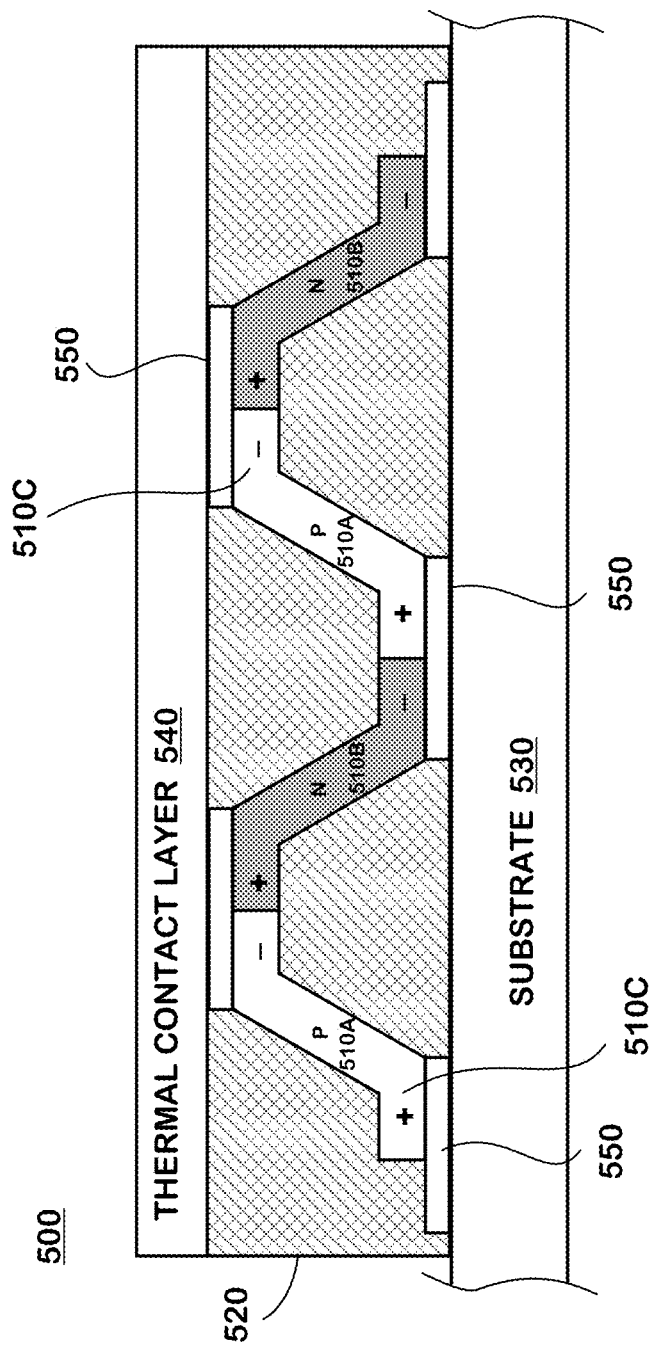
FIG. 5 illustrates an exemplary configuration of a thermoelectric energy harvester according to another embodiment of the present invention.

As shown in FIGS. 1-4, the thermoelectric elements are shown having a rectangular vertical structure. However, the thermoelectric elements may include various shapes and orientations. FIG. 5 illustrates an exemplary configuration of a thermoelectric energy harvester 500 according to another embodiment of the present invention. The thermoelectric energy harvester 500 may include a plurality of thermoelectric elements 510A, 510B above the substrate layer 530 and within a dielectric layer 520 above the substrate layer 530. The thermoelectric elements 510A, 510B may be arranged in an array while alternating the type of material (e.g., between n-type and p-type) in the adjacent thermoelectric elements 510A and 510B. The plurality of thermoelectric elements 510A, 510B may be connected in series via interconnects 550. A thermal contact layer 540 may be provided above the thermoelectric elements 510A, 510B to dissipate the heat applied to the thermoelectric energy harvester 500.

As shown in FIG. 5, the thermoelectric elements 510A and 510B may be slanted. In addition, the thermoelectric elements 510A and 510B may include connecting portions 510C on one or both ends of the thermoelectric elements 510A and 510B that connect to the interconnects 550. The dielectric layer 520 may allow for the thermoelectric elements 510A and 510B to include various shapes and orientations. The orientation and/or shape of the thermoelectric elements 510A and 510B may be changed based available space for the thermoelectric energy harvester 500 and/or the system performance requirements. Changing the orientation of the thermoelectric elements 510A and 510B may reduce the space available (e.g., vertical space), while maximizing the surface area of the thermoelectric element 510A and 510B that is adjacent to the dielectric layer 520.

Although the invention has been described above with reference to specific embodiments, the invention is not limited to the above embodiments and the specific configurations shown in the drawings. For example, some components shown may be combined with each other as one embodiment, or a component may be divided into several subcomponents, or any other known or available component may be added. Those skilled in the art will appreciate that the invention may be implemented in other ways without departing from the spirit and substantive features of the invention. The present embodiments are therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A microfabricated thermoelectric energy harvester, comprising:
    an integrated circuit substrate comprising an integrated circuit;
    a thermoelectric device, including a plurality of p-type and n-type thermoelectric elements formed as layers on the integrated circuit substrate and connected in series while alternating between the p-type and the n-type thermoelectric elements and coupled to the integrated circuit; and
    a cap monolithically integrated with the integrated circuit substrate to enclose the thermoelectric elements between the cap and the integrated circuit substrate.

2. The microfabricated thermoelectric energy harvester of claim 1, wherein a low pressure is provided around the thermoelectric elements and between the cap and the substrate.

3. The microfabricated thermoelectric energy harvester of claim 1, further comprising a thermal contact layer disposed above the cap.

4. The microfabricated thermoelectric energy harvester of claim 1, wherein each thermoelectric element has a top and a bottom, wherein the top of one thermoelectric element is connected to the top of a first adjacent thermoelectric element and the bottom of the one thermoelectric element is connected to the bottom of a second adjacent thermoelectric element.

5. The microfabricated thermoelectric energy harvester of claim 4, wherein the thermoelectric elements are connected via interconnects and a barrier metal is included between each interconnect and the thermoelectric elements.

6. The microfabricated thermoelectric energy harvester of claim 1, wherein each p-type thermoelectric element is adjacent to only n-type thermoelectric elements.

7. The microfabricated thermoelectric energy harvester of claim 1, wherein the integrated circuit substrate is a semiconductor substrate.

8. The microfabricated thermoelectric energy harvester of claim 1, wherein a vacuum is provided around the thermoelectric elements and between the cap and the integrated circuit substrate.

9. The microfabricated thermoelectric energy harvester of claim 1, wherein the cap includes a substrate.

10. The microfabricated thermoelectric energy harvester of claim 1, further comprising a plurality of conductive interconnects formed as at least one layer on the cap, the plurality of conductive interconnects electrically connecting the p-type and n-type thermoelectric elements.

11. The microfabricated thermoelectric energy harvester of claim 10, further comprising a barrier metal formed as at least one layer between the plurality of conductive interconnects and the p-type and n-type thermoelectric elements.

12. The microfabricated thermoelectric energy harvester of claim 1, further comprising a thermal contact layer group formed on and separate from the cap, the thermal contact layer group including a non-conductive layer and a metal layer, wherein the non-conductive layer is thinner than the metal layer.

13. The microfabricated thermoelectric energy harvester of claim 1, further comprising a dielectric layer formed over the substrate, wherein the plurality of p-type and n-type thermoelectric elements are disposed within the dielectric layer.

14. The microfabricated thermoelectric energy harvester of claim 13, wherein the dielectric layer is a polyimide layer.

15. The microfabricated thermoelectric energy harvester of claim 13, wherein the plurality of p-type and n-type thermoelectric elements have higher thermal conductivity than the dielectric layer.

16. The microfabricated thermoelectric energy harvester of claim 13, wherein the dielectric layer is an electrical insulator and has a lower thermal conductivity than the substrate.

17. The microfabricated thermoelectric energy harvester of claim 1, further comprising an additional circuit component formed at least one of: on the integrated circuit substrate, or in the integrated circuit substrate.

18. The microfabricated thermoelectric energy harvester of claim 17, wherein an output of the thermoelectric device is connected to the additional circuit component to provide electrical energy to the additional circuit component.

19. The microfabricated thermoelectric energy harvester of claim 18, wherein the additional circuit component includes a sensor.

20. The microfabricated thermoelectric energy harvester of claim 17, wherein the additional circuit component is connected to the thermoelectric device to control the thermoelectric device.

21. The microfabricated thermoelectric energy harvester of claim 17, wherein the additional circuit component is connected to the thermoelectric device to provide a current to control the thermoelectric device to provide cooling.

22. The microfabricated thermoelectric energy harvester of claim 1, wherein the plurality of p-type and n-type thermoelectric elements have a concentration of at least one of a doping level or a scattering element that is increased at one end of the thermoelectric elements as compared to an opposite end of the thermoelectric elements.

23. A microfabricated thermoelectric energy harvester, comprising:
- an integrated circuit substrate comprising an integrated circuit;
- means for providing a plurality of p-type thermoelectric conduction paths as layers on the integrated circuit substrate;
- means for providing a plurality of n-type thermoelectric conduction paths as layers on the integrated circuit substrate and coupled to the integrated circuit, the means for providing the plurality of n-type thermoelectric conduction paths connected to and alternating with the means for providing the plurality of p-type thermoelectric conduction paths; and
- means for enclosing an area about the means for providing the plurality of n-type thermoelectric conduction paths and the means for providing the plurality of p-type thermoelectric conduction paths on the integrated circuit substrate.

* * * * *